United States Patent
Chang et al.

(10) Patent No.: US 7,511,650 B2
(45) Date of Patent: Mar. 31, 2009

(54) DIGITAL TO ANALOG CONVERTER

(75) Inventors: Yaw-Guang Chang, Tainan County (TW); Ling-Yun Wang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/905,563

(22) Filed: Oct. 2, 2007

(65) Prior Publication Data

US 2008/0122672 A1 May 29, 2008

Related U.S. Application Data

(63) Continuation-in-part of application No. 11/563,321, filed on Nov. 27, 2006, now Pat. No. 7,375,670.

(51) Int. Cl.
*H03M 1/66* (2006.01)
(52) U.S. Cl. .................. 341/145; 341/144; 341/154
(58) Field of Classification Search ......... 341/144–145, 341/154
See application file for complete search history.

(56) References Cited

U.S. PATENT DOCUMENTS

| 6,326,913 | B1 * | 12/2001 | Chao et al. | 341/144 |
| 7,161,517 | B1 * | 1/2007 | Yen et al. | 341/145 |
| 7,236,114 | B2 * | 6/2007 | Ahn | 341/144 |
| 7,365,670 | B2 * | 4/2008 | Lan | 341/145 |
| 7,375,670 | B1 * | 5/2008 | Wang et al. | 341/145 |

* cited by examiner

*Primary Examiner*—Khai M Nguyen
(74) *Attorney, Agent, or Firm*—Rabin & Berdo, P.C.

(57) ABSTRACT

A digital-to-analog converter is provided. The DAC includes a R-string section, a first DAC section, a second DAC section, a multiplexer, and an operational amplifier. The R-string section provides a first group of voltage levels and a second group of voltage levels. The first DAC section provides the output voltage according to the input word when the input word corresponds to a voltage level within a range of the first group of voltages levels. The second DAC section provides a second and a third voltage levels according to the remaining bits. The multiplexer is coupled to the second DAC section to provide an intermediate voltage from the first and the second voltage levels according to the LSB bit. The operational amplifier averages the intermediate voltage and one of the first and the second voltage levels to generate the output voltage.

11 Claims, 3 Drawing Sheets

DIGITAL TO ANALOG CONVERTER

CROSS-REFERENCE TO RELATED APPLICATIONS

This application is a continuation-in-part of U.S. application Ser. No. 11/563,321, filed on Nov. 27, 2006, hereby incorporated by reference as it fully set forth herein.

BACKGROUND

1. Field of Invention

The present invention relates to digital-to-analog converters. More particularly, the present invention relates to a digital-to-analog converter having multiple DAC sections to process different voltage levels according to an input word.

2. Description of Related Art

Conventional resistor string (R-string) digital-to-analog converters (DAC) use a string of resistors to provide various voltages levels and a selector including select lines corresponding to each voltage level. The conventional R-string DAC requires a total of $2^N$ select lines to convert N bits of data. In an age where chip size continues to shrink, using a large number of select lines such as $2^N$ select lines is not area efficient and may waste much chip space.

In U.S. Ser. No. 11/563,321, a dual output DAC was disclosed to reduce the number of select line from $2^N$ to $2^{N-1}$, which saves a significant amount of area. Please refer to FIG. 1, a block diagram of the dual output DAC. The dual output DAC includes an R-string section 102, a DAC section 104, a multiplexer section 106, and an operational amplifier 108. An input word may be divided into a least significant bit (LSB) and the remaining bits. The DAC section 104 selects two voltage levels from the R-string section 102 according to the remaining bits of the input word. The multiplexer 106 then selects one of the voltage levels according to the LSB, so that the operational amplifier 108 may average the first voltage of the two voltage levels with the selected voltage level as the final output of the DAC. Therefore the dual output DAC requires only $2^{N-1}$ select lines to accomplish converting an N-bit input word.

However, the operational amplifier 108 is limited in its voltage input range. Thus, the gamma curve produced by the DAC may be distorted when the operational amplifier 108 attempts to process very large voltage differences. For example, when the input word selects voltage levels near the rail voltages, distortion may occur to produce a non-linear output gamma curve.

For the forgoing reasons, there is a need for a new type of DAC, where distortion caused by the operational amplifier is accounted for in the design to provide a linear gamma curve.

SUMMARY

The present invention is directed to a digital-to-analog converter, that it satisfies this need of compensating the distortion caused by the operational amplifier. The digital-to-analog converter (DAC) for converting an input word into an output voltage is provided, where the input word includes a least significant bit (LSB) and remaining bits. The DAC includes an R-string section, a first DAC section, a second DAC section, a multiplexer, and an operational amplifier. The R-string section provides a first group of voltage levels and a second group of voltage levels. The first DAC section provides the output voltage according to the input word when the input word corresponds to a voltage level within a range of the first group of voltages levels. The second DAC section provides a second and a third voltage levels according to the remaining bits when the input word corresponds to a voltage level within a range of the second group of voltage levels. The multiplexer is coupled to the second DAC section to provide an intermediate voltage from the first and the second voltage levels according to the LSB bit. The operational amplifier averages the intermediate voltage and one of the first and the second voltage levels to generate the output voltage.

The use of single output DAC to select the voltage levels one-to-one from the R-string section allows the voltage levels at the high and low ends of the R-string section to be averaged by the operational amplifiers linearly.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
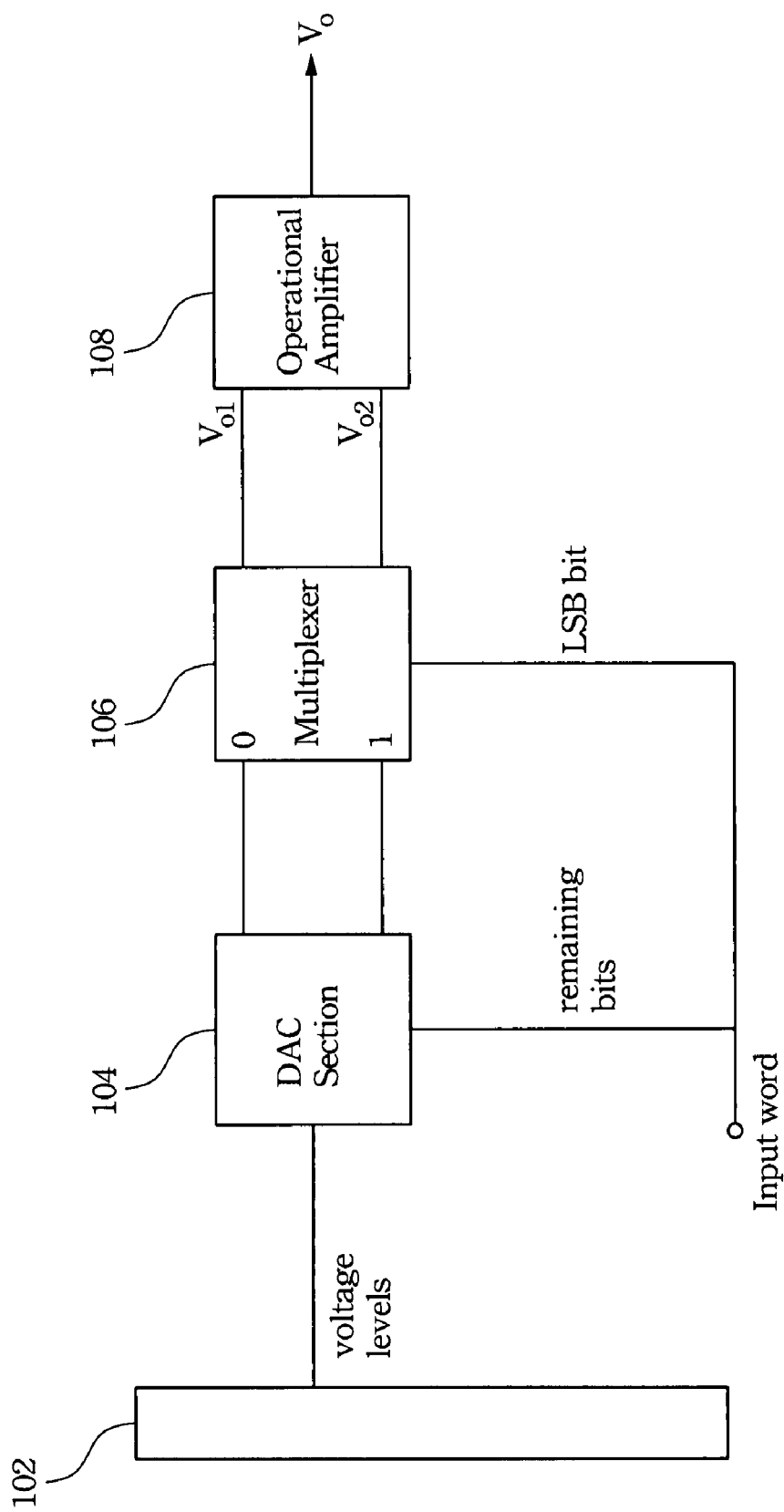
FIG. 1 is a dual output DAC.

Reference will now be made in detail to the present preferred embodiments of the invention, examples of which are illustrated in the accompanying drawings. Wherever possible, the same reference numbers are used in the drawings and the description to refer to the same or like parts.

Figure 2:
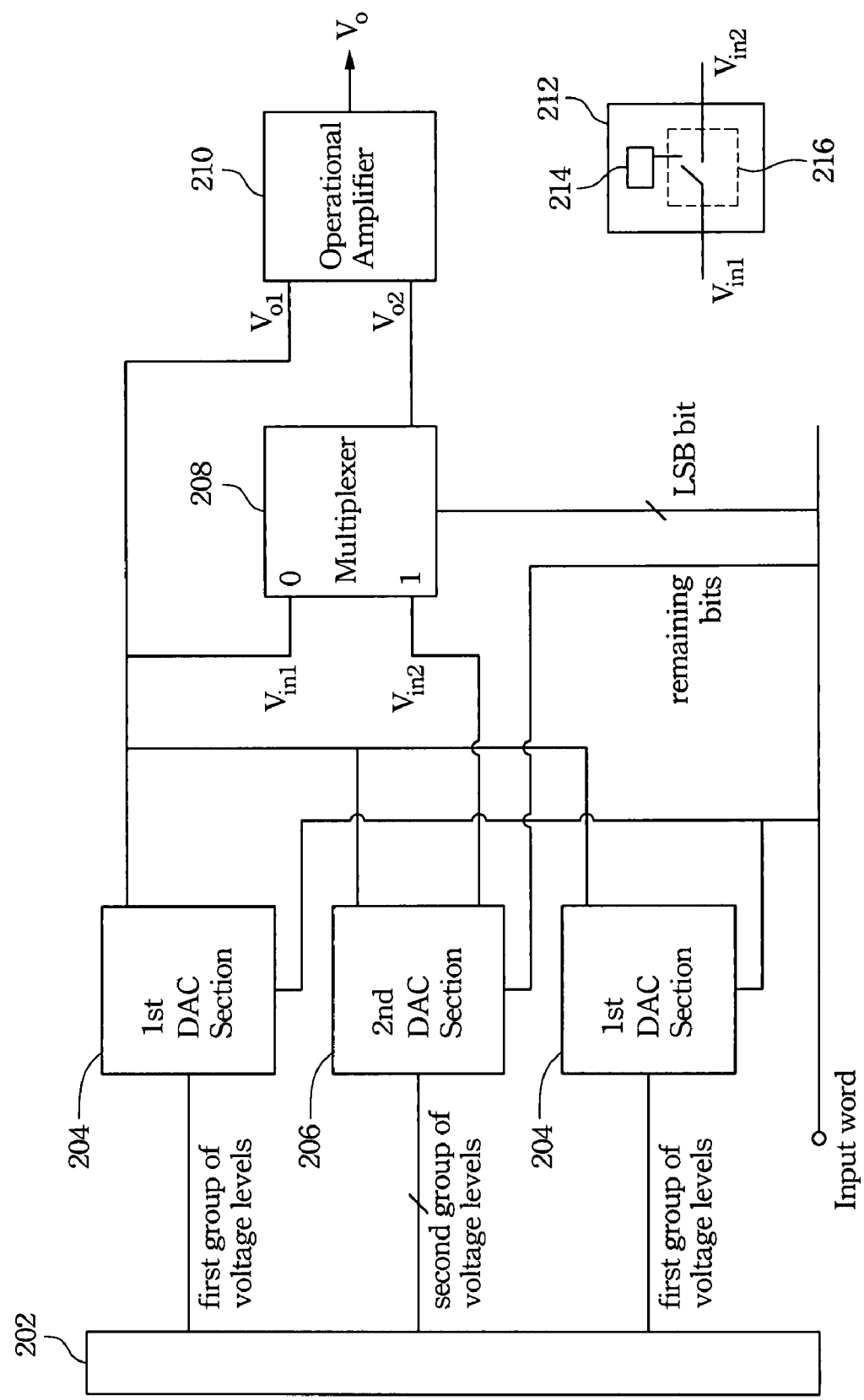
FIG. 2 is a block diagram of the DAC according to an embodiment of the present invention.

Please refer to FIG. 2, which illustrates one embodiment of the present invention. A digital-to-analog converter (DAC) 200 converts an input word into an output voltage, where the input word includes a least significant bit (LSB) and remaining bits, and the DAC includes an R-string section 202, a first DAC section 204, a second DAC section 206, a multiplexer 208, and an operational amplifier 210. The R-string section may provide a first group of voltage levels and a second group of voltage levels. For example, a source drive with an 8-bit (N=8) input word would require the R-string section 202 to have a total of at least 256 voltage levels ($2^N$=256). The first group of voltage levels may include voltage levels that generate output voltages significantly distorted to the corresponding gray scale. The voltage levels in the first group may be grouped near the two extremes of the R-string section (ie. V0~V15 and V240~255). These voltages levels may be out of the input range for the operational amplifier 210 to process them linearly. The distortion causes the gamma curve of the first group of voltage levels to be steeper. The second group of voltage levels may be capable of being processed linearly by the operational amplifier 210 (ie. V16~V239). Therefore, the slope of the gamma curve of the first group of voltage levels is steeper than the slope of the gamma curve of the second group of voltage levels.

The first DAC section 204 provides the output voltage according to the input word when the input word corresponds to a voltage level within a range of the first group of voltage levels. For example, the 8-bit input word may be 00000000, which may correspond to V0. The value of V0 may be very near the upper rail voltage (ie. 5V), thus V0 belongs to the first group of voltage levels. The first DAC section 204 may be a signal output DAC, where one voltage level corresponds to one input word. When the source drivers requires a 8-bit input word, the first DAC section 204 may only require 4-bit DAC sections to accommodate the top 4-bits of voltage levels (V0~V15) and the bottom 4-bits of voltage levels (V240~V255). The output voltage provided by the first DAC section may be sent to the multiplexer 208 as Vin1, and also sent to the operational amplifier 210 as Vo1. Therefore, if the input word corresponds to a voltage level (ie. V0) within the range of the first group of voltage levels, then Vo1 will carry V0 and Vin1 will carry V0.

A switching module 212 may be implemented so that when the input word corresponds to a voltage level from the first group of voltage levels, the switching module 212 couples a voltage level selected from the first DAC section to input into the multiplexer when the input word corresponds to a voltage level within a range of the first group of voltages levels. The switching module 212 may include a case sensor 214 determining the corresponding voltage level to provide a control signal, and a switching device 216 switched by the control signal to couple the voltage level selected from the first DAC section 204 to input into the multiplexer 208. For example, Vin1 and Vin2 may be electrically connected and inputted into the multiplexer 208 when the case sensor 214 detects an input word, which corresponds to a voltage level within the range of the first group of voltage levels. In this case, Vo1 may be equal to Vo2 regardless of the selection of the multiplexer 208, which then the operational amplifier 210 averages to generate an output voltage (Vo).

The second DAC section 206 provides a first voltage level and a second voltage level according to the remaining bits when the input word corresponds to a voltage level within a range of the second group of voltage levels. For example, the 8-bit input word may be 00010000, which may correspond to V16. The operational amplifier 210 may be capable of linearly interpolating the value of V16 without significant distortion. Therefore, V16 may belong to the second group of voltage levels. The second DAC section 206 may be a dual-output DAC as disclosed in U.S. Ser. No. 11/563,321, where the remaining bits of the input word select the first and second voltages levels from the R-string section 202. The first voltage level may deviate from the second voltage level by two voltage levels. The second DAC section 206 outputs the selected first and second voltage levels to the inputs of the multiplexer 208 as Vin1, and Vin2. When the source drivers requires an 8-bit input word, the second DAC section 206 may only require a 7-bit DAC section to accommodate the voltage levels within the second group of voltage levels (V16~V239). Although the embodiment of the present invention requires an additional DAC section for processing voltages levels towards the extreme ends of the gamma curve, the area of the DAC is still smaller than a convention 8-bit DAC, which requires a total of 256 select lines.

The multiplexer 208 may be coupled to the second DAC section to provide an intermediate voltage from the first and the second voltage levels according to the LSB bit. The intermediate voltage is indicated as Vo2 in FIG. 2. The multiplexer 208 may select the second voltage level to be the intermediate voltage when the LSB bit of the input word is 1, the multiplexer may select the first voltage level to be the intermediate voltage when the LSB bit of the input word is 0. In this case, the switching module 212 does not connect Vin1 and Vin2 together, thus Vo1 will be the first voltage level. Vo2, in this case, may be the second voltage level or the first voltage level depending on the LSB. For example, the first voltage level may be V100, and the second voltage level may be V102. If the output voltage level is desired to be V100, then V100 will be selected as Vo2, which by averaging V100 and V100 through the operational amplifier 210 yields V100. On the other hand, if V101 is the desired output, V102 will be selected as Vo2, which by averaging V100 and V102 through the operational amplifier yields V101.

Figure 3:
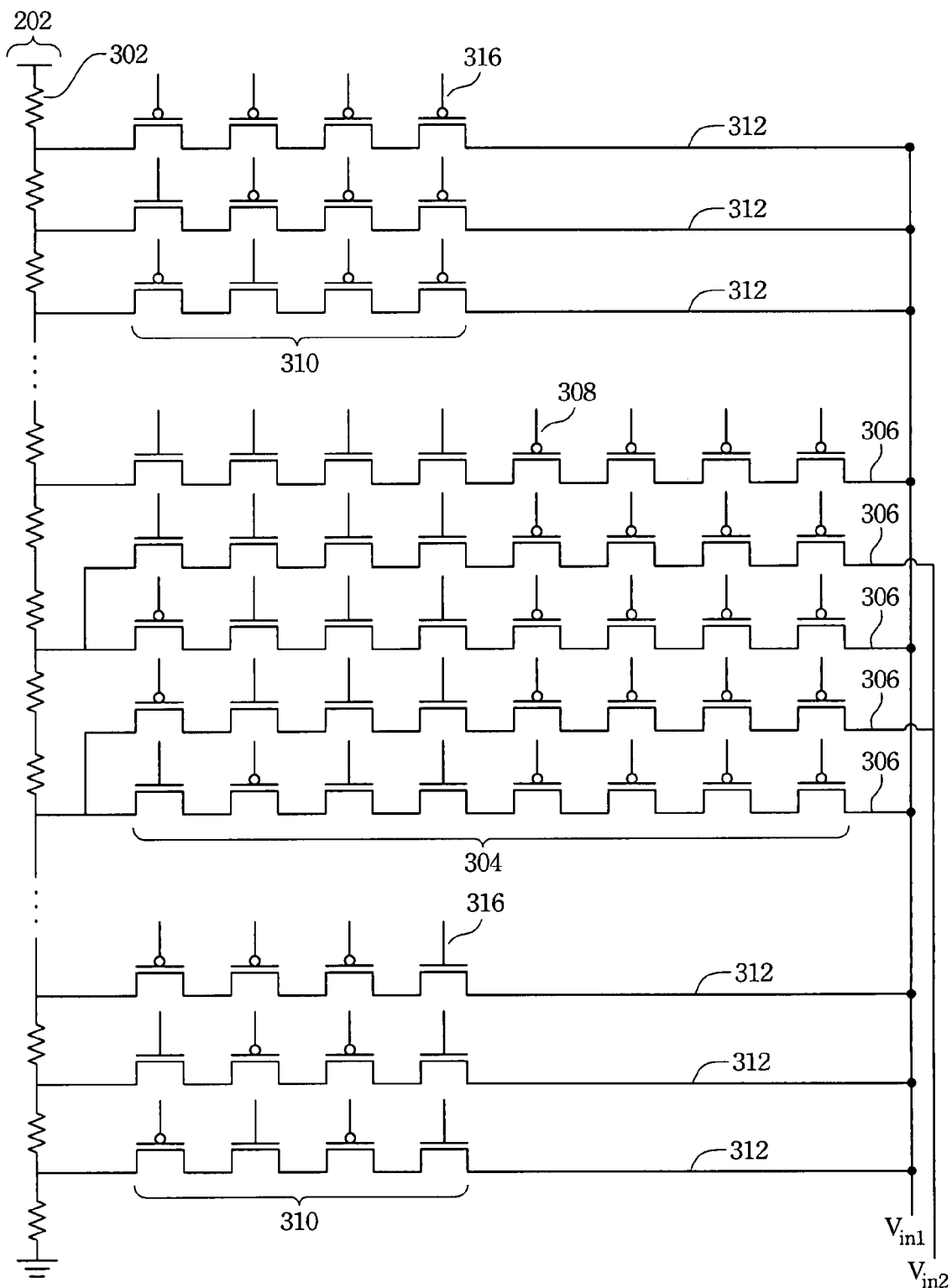
FIG. 3 is a circuit diagram of the R-string section and the first and second DAC sections according to the embodiment of the present invention.

More specifically, please refer to FIG. 3, an illustration of the connection between the R-string section 202 and the first and second DAC sections 204, 206 according the embodiment of the present invention. The R-string section 202 includes a plurality of resistors 302 electrically connected in series to provide the voltage levels. The first DAC section 204 includes a 1-of-N selector 310 having a plurality of first selecting lines 312 coupled to the R-string section to provide the corresponding voltage level from the first group of voltage levels, and each of the first selecting lines 312 includes series-connected first switching elements 316. The switching elements 316 may be CMOS transistor switches. For example, a 4-bit first DAC section may have four switching elements on each first selecting line 312. Each first selecting line 312 corresponds to a unique voltage level, which couples through to Vin1. The second DAC section includes a 2-of-N selector 304 having a plurality of second selecting lines 306 coupled to the R-string section to provide the corresponding first and second voltage levels from the second group of voltage levels, and each of the second selecting lines 306 may include series-connected second switching elements 308. The second selecting lines 306 sensing the first voltage levels may be connected to Vin1, while the second selecting line 306 sensing the second voltage levels may be connected to Vin2.

From the above description of the embedment of the present invention, a DAC is provided which is smaller in area than a conventional DAC. Also the DAC according the embodiment of the present invention eliminates the problem of non-linearity of the gamma curved caused by a pure dual output DAC.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog converter (DAC), for converting an input word into an output voltage, wherein the input word has a least significant bit (LSB) and remaining bits, the DAC comprising:

an R-string section providing a first group of voltage levels and a second group of voltage levels;

a first DAC section, providing a first voltage level according to the input word when the input word corresponds to a voltage level within a range of the first group of voltage levels;

a second DAC section, providing a second voltage level and a third voltage level according to the remaining bits when the input word corresponds to a voltage level within a range of the second group of voltage levels;

a multiplexer, coupled to the second DAC section to provide an intermediate voltage from the second and the third voltage levels according to the LSB bit; and an operational amplifier generating the output voltage by using the first voltage level when the input word corresponds to the voltage level within the range of the first group of voltage levels, or by averaging the intermediate voltage and the second voltage level when the input word corresponds to the voltage level within the range of the second group of voltage levels.

2. The DAC as claimed in claim 1, wherein a slope of a gamma curve of the first group of voltage levels is steeper than a slope of the gamma curve of the second group of voltage levels.

3. The DAC as claimed in claim 1, wherein the R-string section comprises a plurality of resistors electrically connected in series to provide one of the first group and the second group of voltage levels.

4. The DAC as claimed in claim 1, wherein the first DAC section comprises a 1-of-N selector having a plurality of first selecting lines coupled to the R-string section to provide the first voltage level from the first group of voltage levels, and each of the first selecting lines comprises series-connected first switching elements.

5. The DAC as claimed in claim 4, wherein the second DAC section comprises a 2-of-N selector having a plurality of second selecting lines coupled to the R-string section to provide the corresponding second and third voltage levels from the second group of voltage levels, and each of the second selecting lines comprises series-connected second switching elements.

6. The DAC as claimed in claim 1, further comprising a switching module for coupling the first voltage level selected from the first DAC section to input into the multiplexer when the input word corresponds to the voltage level within the range of the first group of voltages levels.

7. The DAC as claimed in claim 6, wherein the switching module comprises a case sensor determining the first voltage level to provide a control signal, and a switching device switched by the control signal to couple the first voltage level selected from the first DAC section to input into the multiplexer.

8. The DAC as claimed in claim 1, wherein the multiplexer selects the second voltage level to be the intermediate voltage when the LSB bit of the input word is 0, and selects the third voltage level to be the intermediate voltage when the LSB bit of the input word is 1.

9. The DAC as claimed in claim 1, wherein the voltage levels are grayscale voltages.

10. The DAC as claimed in claim 1, wherein the multiplexer couples to the first DAC section and the second DAC section to provide the intermediate voltage, the intermediate voltage equals the first voltage level when the input word corresponds to the voltage level within the range of the first group of voltage levels, and the intermediate voltage is one of the second and the third voltage levels depending on the LSB bit when the input word corresponds to the voltage level within the range of the second group of voltage levels.

11. The DAC as claimed in claim 1, wherein the first voltage level deviates from the second voltage level by two voltage levels.

\* \* \* \* \*